United States Patent [19]

Chang et al.

[11] Patent Number: 4,965,227
[45] Date of Patent: * Oct. 23, 1990

[54] PROCESS FOR MANUFACTURING PLASTIC PIN GRID ARRAYS AND THE PRODUCT PRODUCED THEREBY

[75] Inventors: Kin-Shiung Chang, Meriden; Thomas A. Armer, New Haven, both of Conn.; William G. Bridges, San Jose, Calif.

[73] Assignee: Olin Corporation, New Haven, Conn.

[*] Notice: The portion of the term of this patent subsequent to Mar. 28, 2006 has been disclaimed.

[21] Appl. No.: 145,977

[22] Filed: Feb. 2, 1988

Related U.S. Application Data

[63] Continuation-in-part of Ser. No. 52,327, May 21, 1987, Pat. No. 4,816,426, which is a continuation-in-part of Ser. No. 16,614, Feb. 19, 1987, abandoned.

[51] Int. Cl.⁵ .......................................... H01L 21/56
[52] U.S. Cl. .................................... 437/207; 437/215; 174/50.51; 206/331; 206/347; 361/400
[58] Field of Search ............... 437/207, 215; 174/50.6, 174/52 PE, 52 R; 206/347, 331; 29/827; 361/387, 400

[56] References Cited

U.S. PATENT DOCUMENTS

Re. 32,540 11/1987 Murphy .
4,124,864 11/1978 Greenberg .
4,340,902  7/1982 Honda et al. .
4,442,938  4/1984 Murphy .
4,521,469  6/1985 Butt et al. .
4,525,422  6/1985 Butt et al. .
4,549,651 10/1985 Alemanni .
4,552,422 11/1985 Bennett et al. .
4,582,556  4/1986 Butt et al. .
4,593,342  6/1986 Lindsay .
4,618,739 10/1986 Theobald .
4,677,526  6/1987 Muehling .
4,688,152  8/1987 Chia .
4,696,526  9/1987 Newton et al. .
4,706,811 11/1987 Jung et al. .
4,709,301 11/1987 Yamaguti ............................. 361/387
4,711,023 12/1987 Marchisi et al. ....................... 29/827
4,711,688 12/1987 Pienimaa ......................... 156/244.12
4,712,127 12/1987 Colombo et al. ..................... 357/72
4,729,010  3/1988 Tsuchiya et al. .
4,750,030  6/1988 Hatakeyama ......................... 357/72
4,750,092  6/1988 Werther ............................... 361/400
4,769,344  9/1988 Sakai et al. .......................... 437/216
4,789,011 12/1988 Moloney ............................. 140/147
4,816,426  3/1989 Bridges et al. ....................... 174/52.2

Primary Examiner—Olik Chaudhuri
Assistant Examiner—Andrew Griffis
Attorney, Agent, or Firm—Gregory S. Rosenblatt; Paul Weinstein

[57] ABSTRACT

A process for forming an integrated circuit pin grid array package comprising a flexible metal tape adapted for use in tape automated bonding with a plurality of holes. Terminal pins are inserted in the holes and the tapes and pins are disposed within a mold so that a cavity is formed about the pins and tape. The cavity is filled with a polymer resin so as to at least partially surround and support the pins and tape and thereby form the plastic encapsulated pin grid array.

35 Claims, 16 Drawing Sheets

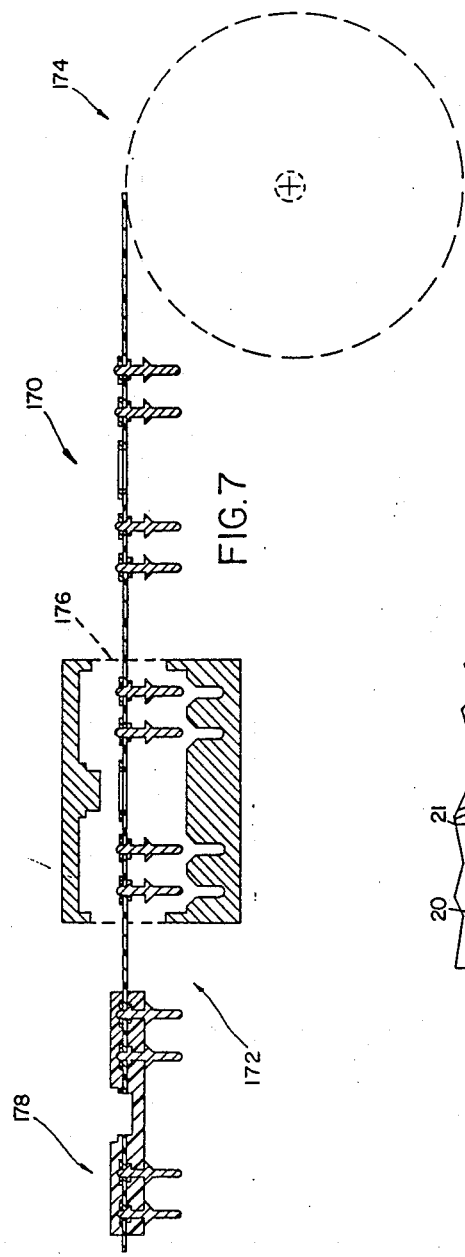
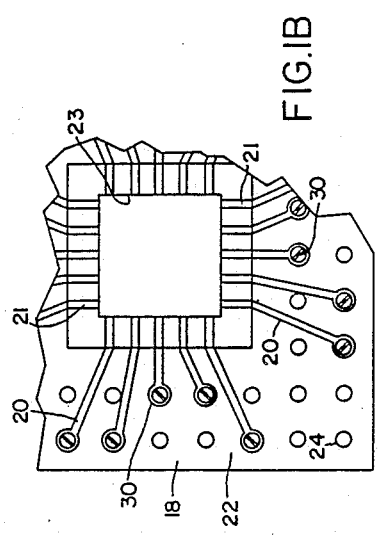
FIG.7
FIG.1B

PROCESS FOR MANUFACTURING PLASTIC PIN GRID ARRAYS AND THE PRODUCT PRODUCED THEREBY

This application is a continuation-in-part of Ser. No. 52,327, filed May 21, 1987, by William G. Bridges et al. now U.S. Pat. No. 4,816,426 for "Process For Manufacturing Plastic Pin Grid Arrays And The Product Produced Thereby" which in turn is a Continuation-In-Part of Ser. No. 16,614, filed Feb. 19, 1987 (now abandoned).

While the invention is subject to a wide range of applications, it particularly relates to both the process of constructing plastic pin grid arrays and the resulting product thereof In particular, the disclosed plastic pin grid array includes flexible and semi-rigid electronic circuits, for example, tape automated bonding (TAB) tape having terminal pins electrically connected thereto and optionally encapsulated within a polymer resin.

In the past, pin grid arrays were manufactured in plastic or ceramic packages Plastic pin grid arrays were typically produced using printed wiring board (PWB) substrates having small printed circuit patterns connecting the bonding pads on the integrated circuit chip to the input-output (I/O) pins. Multiple layers of these printed circuit patterns were stacked and bonded together to form a package which could provide complex interconnects and an increased number of I/O pins.

The plastic packages have several important physical characteristics which significantly improve the operation of the packaged integrated circuit chip as compared with the operational characteristics of ceramic packages. These characteristics include higher current carrying capacity, lower dielectric constant for shorter operational delay times, and reduced inductance and capacitance. Moreover, the circuitry of the PWB substrates is extremely accurate and highly conductive since it can incorporate a metal foil with photodefined circuitry. By contrast, the ceramic packages incorporate circuitry which is fabricated from low conductivity metallization and cannot be as accurately defined.

One disadvantage of the PWB substrates is the requirement for through hole drilling and plating to connect the pins to the circuitry. This results in a more expensive manufacturing procedure. A second disadvantage is that PWB packages dissipate less heat than ceramic substrates.

The present invention incorporates TAB or conventional wire bonding procedures for bonding individual lead ends to the I/O terminal pads located on the active surface of an integrated circuit chip. The flexible or semi-rigid electronic circuit is typically of three general forms of construction. The first is a single layer all metal construction; the second is a two layer construction comprising a metal layer with a dielectric backing such as a polyimide; and the third is a three or five layer construction comprising one or two metal layers adhesively bonded to a dielectric substrate, such as a KAPTON polyimide.

The formation of plastic injection molded pin grid arrays is illustrated on Page 10 of the newsletter entitled Semiconductor Packaging Update, Vol. II, No. 1, January, 1987. The pin grid array illustrated in that article does not appear to have the interconnected circuitry totally encapsulated by molding within the plastic resin as in the present invention. Further, it does not appear that the terminal pins project through the circuitry. Encapsulating the edges of the circuitry and a portion of the pins on both sides of the circuitry is an important aspect of the present invention because the interconnection between the pins and the circuitry is strengthened and environmentally protected after encapsulation with a polymer resin.

The formation of ceramic pin grid array packages incorporating a TAB tape is disclosed in the article entitled "Composite Type Pin Grid Array Package", by Tsutsumi et al. set out in 1986 IEEE, Page 560–563. As illustrated in FIG. 2, a ceramic base has I/O pins projecting therefrom. A polyimide film with wiring paths of copper has via holes for the I/O pins. The polyimide film is placed over the pins and adhesively bonded to the base. Then, the pins are soldered to the wiring paths. Finally, a cap having via holes for the I/O pins is adhesively bonded to the base and film. In this approach, the pins and tape are not encapsulated together but are adhesively bonded between a ceramic cap and base. This technique leaves the edges of the circuit exposed to the environment.

A plastic chip carrier package is disclosed in U.S. Pat. No. 4,618,739. The terminal pins are incorporated in a base component by a process such as plastic injection molding. A metallized plastic tape is bonded onto the base component and the pins are joined to the tape metallization by any desired technique such as welding. To facilitate the joining, through holes in the metallized plastic tape are positioned at the points of contact with the ends of the terminal pins. The through hole openings permit joining the metallized tape with the terminal pin ends by techniques such as laser welding. A plastic cover may be adhesively bonded to the base component. The aforementioned pin grid array is formed of plastic as is the package of the present invention. However, the metallized tape does not have the pins protruding therethrough in order to facilitate interconnection between the metallized tape and the terminal pins. Also, the metallized tape is not encapsulated by the plastic but rather adhesively bonded thereto and the edges of the circuit are exposed to the environment.

The aforenoted problems and difficulties can readily be overcome with this invention wherein the terminal pins are inserted through the flexible or semi-rigid electronic circuitry. Then, after electrically interconnecting the pins to the tape, the pins and tape are encapsulated together with a polymer resin. Preferably, all edges of the tape and the pin to interconnect bonds are encapsulated, minimizing exposure to the environment. This one step encapsulating process can be readily carried out with automatic equipment, if desired, and results in a high reliability package wherein the bonds between the pin and tape are encapsulated and, therefore, reliable and less subject to deterioration.

It is an aim of the present invention to provide an integrated pin grid array package and the process of forming an integrated circuit pin grid array package which avoids the problems and difficulties encountered by the prior art approaches.

It is a further aim of the present invention to provide an integrated pin grid array package and the process of forming an integrated circuit chip carrier package which can be assembled using a low cost, efficiently operated automated assembly.

It is a yet further aim of the present invention to provide an integrated pin grid array package and the process as above wherein a TAB tape, having an integrated circuit chip bonded thereto, is testable prior to molding.

It is a yet further aim of the present invention to provide an integrated pin grid array package and the process of forming an integrated chip carrier package which is simple to carry out using a single molding step.

It is a still further aim of the present invention to provide a pin grid array adapter package and the process of forming a pin grid array adapter package which is relatively inexpensive to manufacture with a single molding step.

These and other aims will become more apparent from the following description and drawings in which like elements have been given like reference numbers and in which primed or multiprimed number comprise similar elements providing similar functions.

FIG. 1B illustrates a partial top view of an interconnect tape having the leads forming the circuit pattern extending from terminal pins to the edge of an aperture cut through the tape;

FIG. 7 illustrates a reel to reel operation wherein an interconnect tape having the pins locked on is encapsulated in a mold and rerolled onto a reel;

Figure 1A:
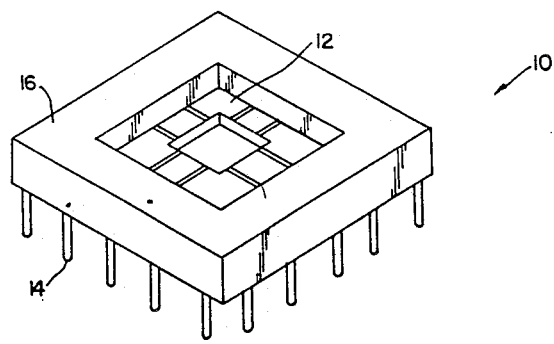
FIG. 1A illustrates an isometric view of a plastic integrated circuit pin grid array package having a plurality of encapsulated terminal pins extending therefrom.

The present invention is particularly directed to an integrated circuit pin grid package 10, an example of which being illustrated in FIG. 1A, and process of forming the package 10 whereby a flexible or semi-rigid circuit tape 12, for example a tape for use in a TAB process, having terminal pins 14 extending therethrough are encapsulated within a polymer resin 16. There are three general forms of electronic circuit construction. The first is a single layer or all metal construction; the second is a two layer construction comprising a metal layer with a dielectric backing such as a polyimide; and the third is a three or five layer construction comprising one or two metal layers adhesively bonded to to one or both sides of a dielectric such as KAPTON polyimide. The electronic circuits of the present invention a plurality of holes formed therein through which terminal pins are inserted.

An encapsulated plastic pin grid array chip carrier using a single layer, all metal construction is disclosed in U.S. Pat. No. 4,677,526 issued to Muehling. The terminal pins are formed by bending a metal leadframe prior to encapsulation. In U.S. Pat. No. 4,677,526 the spacing between terminal pins must be large enough to permit electrical isolation between leads. The number as well as spacing of the terminal pins is restricted. By using a metal circuit tape into which terminal pins are attached in accordance with the present invention, no positioning or spacing restraints are encountered. The terminal pin count may be as high as desired. Additionally, the circuit tape is not used for support so the circuit tape may be as thin as desired. 1 ounce copper (.0025 inches thick) works well as an embodiment of the single layer circuit in accordance with the present invention.

The two layer circuit is generally formed by electrolytically depositing copper on a dielectric carrier. The carrier is usually a polyimide, for example KAPTON, although other dielectrics, such as epoxy glass, may be used. The only constraints on the dielectric carrier are that it be able to withstand the heat of subsequent molding operations, generally about 140° C. to about 260° C. and the overall thickness of the package should be within JEDEC standards, less than 0.160 inch thick including the lid.

In accordance with the present invention, the dielectric carrier is between about .002 inches and about .030 inches thick and preferably from about .005 inches to about .010 inches thick. The electrodeposited copper is from about ¼ ounce to about 4 ounce (.0006 inches thick to about .001 inches thick) and preferably from about ½ ounce to about 2 ounce (.0012 inches thick to about .0048 inches thick).

The three layer circuit is comprised of a wrought copper foil adhesively bonded to a dielectric carrier. The adhesive is about .001 inches thick and the copper and polyimide layers are of similar thicknesses as disclosed in the two layer circuit tape.

Figure 2B:
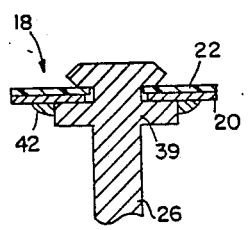
FIG. 2B is a side view in cross section of a terminal pin connected to a TAB tape which is inverted as compared to the tape in FIG. 2A.
Figure 2A:
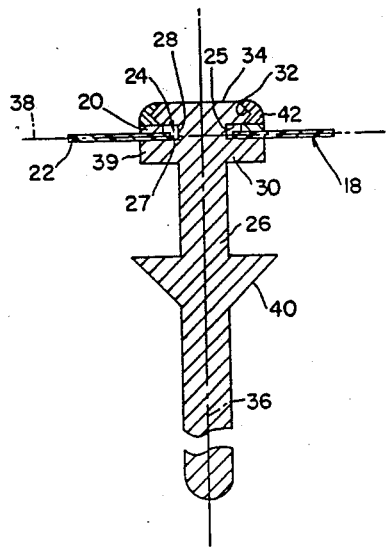
FIG. 2A is a side view in cross section of a terminal pin connected to a TAB tape.

Referring to FIGS. 1B, 2A and 2B, there is illustrated a three layer interconnect tape 18 defining a metal interconnect circuit pattern or layer 20 adhesively bonded to a dielectric layer 22. The metal interconnect pattern layer 20 may be formed of any desired material, such as for example, copper or copper alloy while the dielectric layer 22 may be formed of any dielectric material, such as a KAPTON polyimide. The interconnect tape 18 has at least one and typically a plurality of holes 24 formed therein to receive terminal pins 26. Preferably, the holes 24 in the interconnect tape 18 are sized for the tape 18 to mechanically interlock with a groove or slot 28 in the pinhead 30. The holes 24 may be formed of a hole 25 in the metal layer 20 and a hole 27 in the plastic layer 22 by any suitable technique, such as photoetching, drilling, stamping or a combination thereof. The diameter of the hole 24 is preferably the same in both the metal and plastic layers 20 and 22, respectively. If desired, it is within the terms of the present invention to form the diameter of the hole 27 in the plastic layer 22 to be slightly less than that of the hole 25 in the metal layer 20. It is thought that the diameter of the hole 27 in the plastic layer 22 may be up to about 33% smaller than the hole 25 in the metal layer 20. Preferably, the hole 27 is up to about 10% smaller than hole 25. A smaller hole 27 in the plastic layer 22 will provide a tighter connection to the pin 26 while decreasing the chance for crimping of the metal layer 20 where the pin head is inserted into the tape hole 24.

The terminal pins are formed from any electrically conductive material. A preferred material based on superior electrical conductivity and a coefficient of thermal expansion which closely matches that of the encapsulating polymer resin is copper or a copper based alloy. Generally, a copper based alloy containing elements for extra strength, such as phosphorus, are used.

The pin head 30 of pin 26 preferably has a V-shaped configuration 32 between the slot 28 and the top surface 34 of pinhead 30. The V-shaped configuration 32 is formed whereby insertion of the pin 26 into the hole 24 does not crimp the tape 18. Although a V-shaped configuration of the pin is illustrated, it is within the terms of the present invention to shape the pin head 30 in any desired configuration to ease the insertion of the pin 26 into the hole 24. For example, the pinhead 30 may have a curved or cylindrical shape. The pin head 30 is preferably slightly greater in diameter than the diameter of the holes 24. Preferably, the largest outside diameter of the pin head 30 is from about 5 to about 15 percent larger than the inside diameter of the hole 25 in the metal layer 20. The outer diameter of the pin head 30 is larger than the inside diameter of the hole 25 to insure electrical contact with the metal layer 20. At the same time, if the outer diameter of the pin head 30 is too large, i.e. over about 15% greater than the diameter of the hole 25, the metal of the metal layer 20 will become crimped and possibly tear. It should also be realized that the outer diameter of the pin head 30 should be large enough so that the terminal pins can be carried with sufficient contact area of the tape that the tape is not bent. It is also within the terms of the present invention to form the outer diameter of the pin head 30 with the same or a smaller diameter than that of the holes 24. Once the pin 26 is inserted into the TAB tape 18, it is carried with its centerline 36 substantially perpendicular to a plane 38 which extends through the TAB tape 18.

The terminal pins 26 may also include a shoulder or collar 39 which forms a seat for the terminal tape 18. The collar 39 serves as a stop to lock the tape 18 into the groove 28. In addition, the collar 39 acts to support the tape 18. In FIG. 2A, the tape 18 is disposed in the slot 28 so that the dielectric layer 22 is in contact with the shoulder 39. The orientation of the tape 18 to the pin 26, as illustrated in FIG. 2A, may be used in each of the embodiments described herein. However, it is also within the terms of the present invention to invert the tape 18 with respect to the pin 26, as shown in FIG. 2B. In this embodiment, the metal layer is in direct contact with the shoulder 39 of pin 26. Good electrical connection between the tape 18 and the terminal pin 26, without further bonding, may result from this orientation. Also, the tape 18 may be bonded, by means such as solder 42, to the collar 39 of pin 26. The pins 26 may also include a tapered cone shaped wall 40 to self-center the pin 26 within a hole in a mold, as explained herein.

Referring to FIG. 1B, there is illustrated a partial top view of an interconnect tape 18 defining a metal interconnect circuit pattern 20. The tape 18 includes a plurality of holes 24 extending therethrough. Any number of holes may be provided. The circuit pattern 29 defines a plurality of leads 21. These leads extend at least to an aperture 23 which extends through the tape 18. Terminal pins 26 extend outward from the surface of the interconnect tape 18. In FIG. 1B, the pinheads 30 are illustrated as being connected to the circuit pattern.

After the pin 26 has been inserted into the interconnect tape 18, it is preferably locked into the hole 24 to insure mechanical continuity and electrical contact between the pin 26 and the metal circuit layer 20. To further insure electrical continuity, the tape may be bonded to the pins 26 by any conventional means, such as soldering, brazing or welding. In the preferred embodiment, the pinhead 36 is coated with a solder 42. Also, the metal layer 20 adjacent the pinhead 30 maybe coated with a solder. A solder flux maybe provided on either the tape 18 or the head 30 of the pin 26 to enhance the flow of solder 42 between the pinhead 30 and the tape 18. The soldering may be accomplished by reflowing the solder on the pin 26 and the tape 18 by any conventional heat application technique such as with hot air, vapor reflow, infrared rays or with a laser. The solder 42 melts and upon solidification bonds the pinhead 30 to the metal layer 20 of tape 18. In order to insure the proper positioning of the pin 26 with respect to the tape 18, the pins 26 may be inserted in a fixture or a jig, not shown, prior to soldering, so that the pins 26 are properly aligned both with respect to each other and to the tape 18. The jig can be an integral part of the mold itself, for example, the base, which can be readily inserted and removed facilitating the molding operation.

Figure 11A:
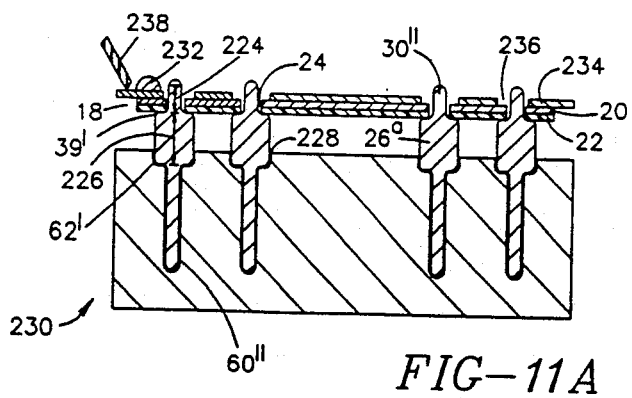
FIGS. 11A through 11C illustrate an alternative pin embodiment as well as a soldering process for attaching the pin to the flexible circuit.

In a second embodiment, terminal pin $26^a$ is designed as shown in FIG. 11A. The pin $26^a$ does not require a locking mechanism. The pin head 30" is designed to have a diameter somewhat less than that of the holes 24 of the interconnect tape 18. The pin head length 224 is somewhat longer than the thickness of the interconnect tape 18. Preferably, the pin head should extend about .010 inches to about .020 inches above the height of the interconnect tape. The pin $26^a$ includes a first shoulder or collar 39' which acts as a support for the interconnect tape 18. The length of the collar is such that it will be entirely embedded within the encapsulating base of the plastic pin grid package as described herein below. The collar terminates at a second shoulder 228 which will form a portion of the base of the pin grid array package.

Attachment of the pin $26^a$ to the interconnect tape 18 is by a metallurgical bond rather than a mechanical bond as in the previous embodiments. The pins $26^a$ are first placed in a loading fixture 230 containing a plurality of holes 60". The holes 60" may include a shoulder shaped section 62' which is sized to receive the second shoulder 228 of the pins $26^a$ rigidly supporting the pins. The interconnect tape 18 is positioned to rest on the first shoulder 39' of the pin $26^a$. Insertion of the interconnect tape 18 is facilitated by the absence of the requirement of mechanical locking. The tape may be placed on the shoulder without the use of excessive force. The tape will lie smoothly on the shoulder without crimping. As described hereinbelow, the interconnect tape 18 may be positioned with either the metal interconnect circuit layer 20 or the dielectric layer 22 in contact with the shoulder 39'.

A mask 234 such as a stencil or screen is placed over the interconnect tape 18. The mask contains a series of apertures 236. The apertures 236 are larger in diameter than the diameter of the pin head 30" and are designed to fit over the pin heads so the interconnect tape rests on the first shoulder 39' of the pins 26$^a$. The diameter of the mask apertures 236 is larger than the diameter of the interconnect holes 24 so that a portion of the interconnect tape 18 adjacent to the pin head 30", is not covered by the mask 234.

The length 224 of the pin heads 30" is chosen so the pin heads extend at least .010 inches above the mask and preferably from about .010 inches to about .020 inches above the mask.

A solder paste 232 is placed on one side of the mask 234. The solder paste is formed by mixing a metal powder with a liquid vehicle to form a slurry. The liquid vehicle comprises from about 5 volume percent to about 35 volume percent of the slurry. The liquid vehicle may be any carrier medium known in the art. A preferred liquid vehicle is an organic flux, such as a mildly activated rosin based flux.

The metal powder is selected to have a melting point greater than the molding temperature of the encapsulating resin but low enough so that thermal degradation of the dielectric layer of the interconnect tape will not occur during soldering. A suitable metal powder has the melting temperature between about 150° C. and about 400° C. and preferably melts in the range of 170° C. to about 300° C. Preferred metal powders are low melting solders comprised of alloys of tin and lead or tin and silver optionally combined with other alloy elements. Any metal powder which melts within the specified range would be within the scope of the present invention.

The solder paste 232 is deposited on one side of the mask 234 and smeared across the mask by a squeegee 238. The squeegee is comprised of any commonly used squeegee material, but preferably should be highly flexible. High flexibility is desired to avoid bending the pin heads 30" or shifting the pin position.

Figure 11B:
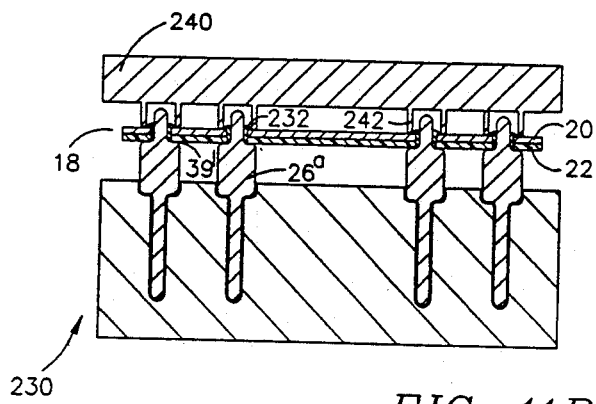

After smearing the solder paste with the squeegee, the solder paste 232 coats the portion of the interconnect tape 18 which was not covered by the mask 234. The interconnect tape holes 24 are also filled except for the region occupied by the pin head 30". The mask is then removed and a loading fixture cover 240 inserted as shown in FIG. 11B. The loading fixture cover contains projections 242. The projections apply pressure to the surface of the interconnect tape 18 pressing the tape firmly against the first shoulder 39' of the pin 26$^a$.

The projection 242 insures the interconnect tape 18 remains taut and in contact with the pins 26$^a$ during the soldering process. Maximum pressure is achieved by placing a weight on the loading fixture cover 240 or clamping the loading fixture 230 to the loading fixture cover 240 by an external clamp, not shown.

The solder is next melted to form a metallurgical bond between the metal interconnect circuit pattern layer 20 of the interconnect tape 18 and the pin 26$^a$. The solder may be melted by any automated or manual procedure known in the art, for example, hot air, infrared or vapor phase soldering.

Figure 11C:
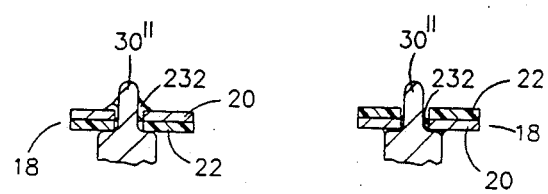

The solder paste may be applied to either the dielectric layer 22 or the conductive layer 20 of the interconnect tape depending whether a "cavity up" or "cavity down" package is desired as described herein below. FIG. 11C illustrates the fillets formed when the solder paste is appled to the dielectric layer 22 of the interconnect tape 18 as well as to the conductive layer 20. The solder will only adhere to the pin 26$^a$ and the conductive layer 20. While the appearance of the fillet is different, both embodiments form a metallurgical bond between the interconnect tape 18 and the pin 26$^a$.

The pin or selectively a portion of the pin may be coated with a second metal to improve solder wetting. For example, electroplating with gold. In another embodiment, not shown, rather than a solder paste, a solder preform, for example a stamped solder ring, may be positioned on the shoulder using the pin head for solder alignment.

Figure 3A:
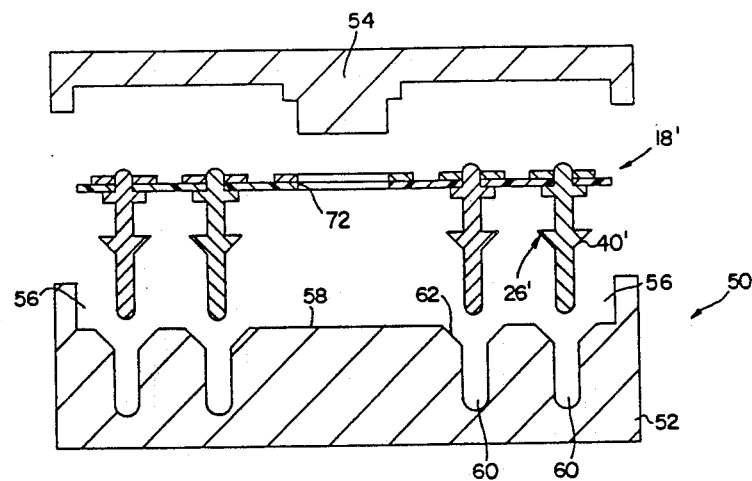
FIGS. 3A through 3E illustrate the series of steps for molding a TAB tape with terminal pins extending therethrough into a plastic integrated circuit pin grid array package in accordance with the present invention.

The assembly comprised of the interconnect tape with the pins soldered thereto is removed from the solder application fixture and loaded into a mold 50 as shown in FIG. 3A. In this approach, the tape 18' serves as a carrier for the insertion of the pins 26' into the mold 50. The mold includes a base component 52 and a cover component 54, both of which may be constructed of any desired material, such as a metal such as steel. The base component 52 has a recess 56 having a first base surface 58. A plurality of holes 60 extending from the first base surface 58 are formed within the base component 52. The holes 60 may include a cone shaped section 62 which are sized to receive the walls 40' of the pins 26'. The cone shaped walls 40' are seated in the cone-shaped section 62 to ensure that the pins 26' are properly aligned within the mold 50.

Figure 3B:
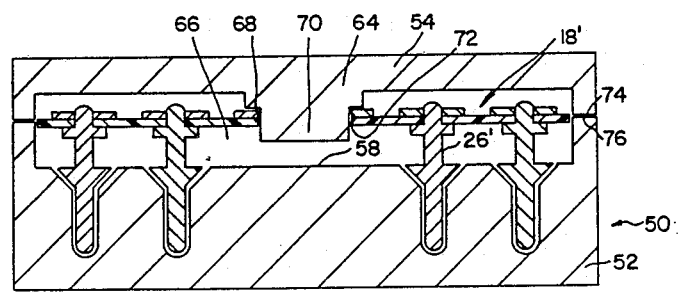

As illustrated in FIG. 3B, the tape 18' is supported above the base surface 58 of the base component 52 by the pins 26'. The cover component 54 is now clamped into position on base component 52. The cover component 54 includes a projection 64 which projects into a cavity 66 formed between the base component 52 and the cover component 54. The projection 64 has an outward extending surface 68 in contact with the tape 18'. The first projection 64 also includes a central portion 70 which extends through an aperture 72 in the tape 18'. An outer surface 74 of the cover component 54 abuts against the surface 76 of the base component 52 and closes mold 50 to form the cavity 66 about the pins 26' and the tape 18'.

Figure 3C:
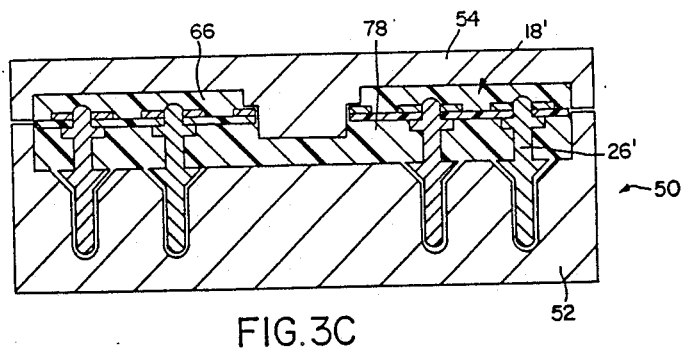

The cavity 66 is then filled, as illustrated in FIG. 3C, with a polymer resin 78 so as to at least partially surround and support the pins 26' and the tape 18'. AS the polymer resin 78 enters, the cavity 66 is filled through molding passageways (not shown) which extend through the base and/or cover components 52 and 54, respectively, at any desired locations.

One preferred method of introducing polymer resin is through an aperture in the cover component as shown in FIG. 3A. Introducing resin from the cover component applies pressure on the interconnect tape firmly pushing the tape against the base of the molding fixture. The pressure on the interconnect tape limits distortion of the tape during molding.

The polymer resin is selected from the group consisting of thermoset and thermoplastic polymer resins. The thermoset polymer resin maybe selected from the group consisting of epoxies, 1-2 polybutadienes, silicone, poly(bismaleimides) and polyimide polymers. Each of these polymers may be filled, if desired, to change the dielectric constant, the coefficient of thermal expansion and the cost of the resulting polymer mixture. The filler may include materials, such as for example, fumed silica, ceramic or quartz. The thermoset epoxy resins typically have a low viscosity and a processing temperature of about 170° to about 300° C. The thermoplastic polymer resin may be selected from the group consisting of polyphenylsulfide, polysulfone, polyarylether, polyamide, polyether ketone, polyethersulfone, polyetherimide, polyimide, thermotropic, "liquid crystalline" polymers and fluoropolymers. The thermoplastic polymer resin may be filled or unfilled for the reasons and with the materials as discussed regarding the thermoset resin. The thermoplastic typically has a high viscosity and a processing temperature of above about 220° C. and preferably from about 220° to 400° C. One suitable group of thermoplastic resins is known as Liquid Crystal Polymers which may be unfilled or filled up to 65 volume % with a filler. An example of a Liquid Crystal Polymer is VECTRA from Celanese Corporation. Although specific groups of thermoplastic and thermosetting polymer resins have been disclosed, it is within the terms of the present invention to use any polymeric material capable of encapsulating the interconnect tape and the pins of the pin grid array packages disclosed herein.

To carry out the present invention, a transfer molding technique using polymeric material at a pressure which is usually less than about 1000 pounds per square inch (psi) is preferable. The present invention preferably incorporates transfer molding since the lower pressure required for the process decreases the probability of damaging the electrical connections during the molding step. It is, however, within the terms of the present invention to use any other molding technique, such as injection molding, where a high viscosity polymer is injected using a relatively high pressure of over about 2000 psi. Usually, thermoplastics are molded using the latter technique. However, it is within the terms of the present invention to transfer mold a thermoset or injection mold a thermoplastic. One difference between the thermoset polymers and the thermoplastic polymers is that the former require a curing time.

Figure 3D:
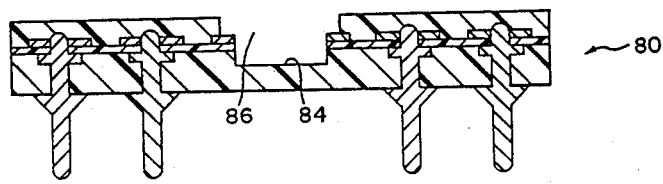

After the polymer resin has filled the mold cavity 66 and has hardened or cured, the resulting integrated circuit pin grid array package 10 is ejected from the mold 50. This may be accomplished by pins extending through the mold (not shown) which may be operated by means such as hydraulic, to push the package 80 out of the mold 50. The finished package 80, as seen in FIG. 3D, may now be trimmed and polished as required.

To prevent the package from sticking to the mold, a mold release agent may be coated on the mold walls prior to injection of the organic polymer. The specific mold release agent is selected in accordance with the particular organic polymer being used. For example, a polyimide may require a zinc stearate, fluropolymer or fatty acid mold release agent.

The package 80 may now have an integrated circuit chip device 82 bonded onto the bottom surface 84 of a recess 86. The chip device 82 is then electrically connected to the leads 88 formed of the metal paths extending from the terminal pins 26' to the recess 86. This electrical interconnection may be made by any conventional technique, such as for example, ultrasonic, thermosonic or thermocompression bonding. Electrical interconnection may be by a TAB process or by conventional wire bonding.

An advantage of the present invention is that the chip 82 and its lead connections can be tested prior to the final assembly of the package 80. Preferably, the testing step would occur prior to the sealing of a cover 90 onto the package 80.

Figure 3E:
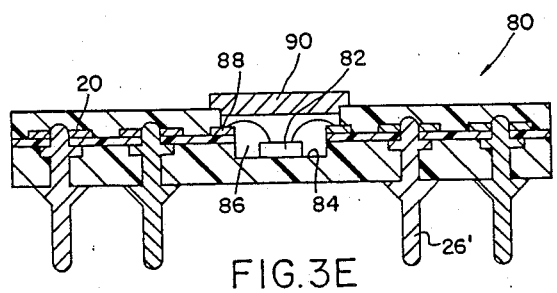

The package 80, as seen in FIG. 3E, may now be sealed within the recess 86. The sealing means may incorporate a cover component 90. The cover component 90 may be constructed of a material selected from the group consisting of metals, alloys, glass, ceramics, organic polymers and combinations thereof. The cover component 90 is sealed into the package 80 to cover recess 86 by any desired means, such as for example by an epoxy adhesive. It is also within the terms of the present invention to fill the recess 86 with a sealing material such as a thermoset or thermoplastic organic polymer as described hereinbefore.

Figure 4A:
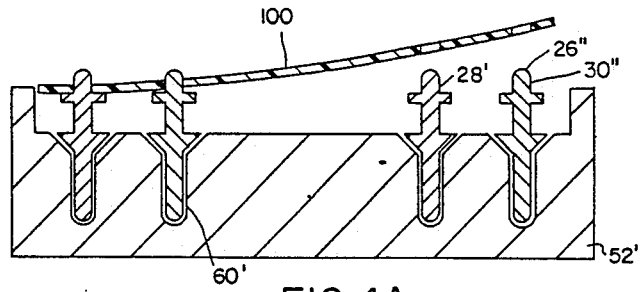
FIGS. 4A through 4F illustrate the steps for molding a plastic integrated circuit pin grid array package of the type illustrated in FIGS. 3A through 3E wherein the pins are inserted into a mold prior to their connection to the TAB tape.

Referring to FIGS. 4A through 4F, there is illustrated a series of steps for forming an integrated circuit pin grid array package 80' wherein the terminal pins 26" are inserted into the holes 60' in the mold base component 52' prior to the insertion of the terminal pins 26" into the TAB tape 18". Preferably, the terminal pins 26" are positioned and affixed to a MYLAR or KAPTON carrier 100 by the grooves 28' in the pin heads 30" as illustrated in FIG. 4A. The pins 26" are essentially the same as illustrated in FIG. 2 except shown without all of the specific details. This method of carrying pins is described in U.S. Pat. No. 4,442,938. The terminal pins 26" while still being held by the carrier 100 are inserted into the holes 60'. The holes 60' are sized to hold the pins 26" while the carrier 100 is being peeled off as shown in FIG. 4A. It is also within the terms of the present invention to insert the terminal pins 26" into holes 60' by any desired technique, such as, for example, by hand.

Figure 4B:
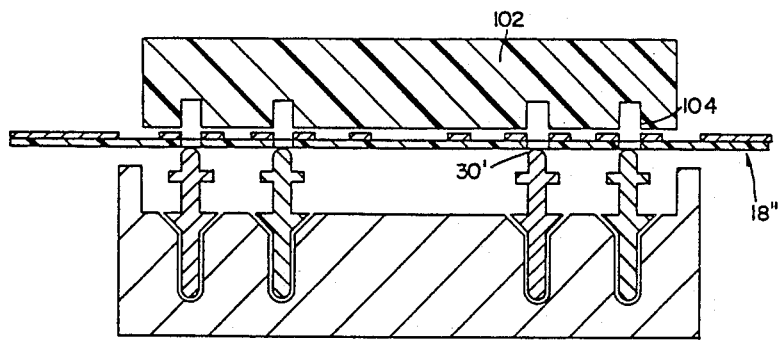

Once the terminal pins 26" are positioned in the base component 52', a TAB tape 18" is positioned over the pins 26" as seen in FIG. 4B. The tape 18" maybe pulled from a reel to increase the automation of the process. Then, the tape 18" is press onto the pins 26" by a fixture 102 which includes holes or slots 104 to accommodate the pin heads 30'. The fixture 102 may be constructed of any material such as a hard rubber in order that it does not damage the tape 18".

Figure 4F:
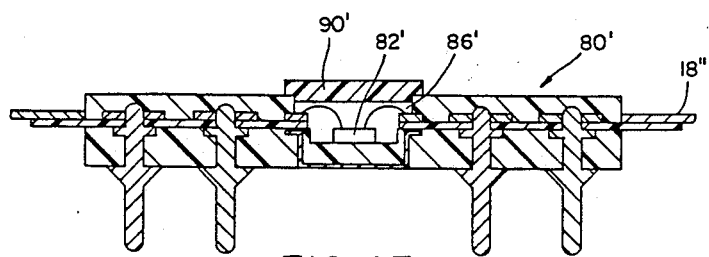
Figure 4C:
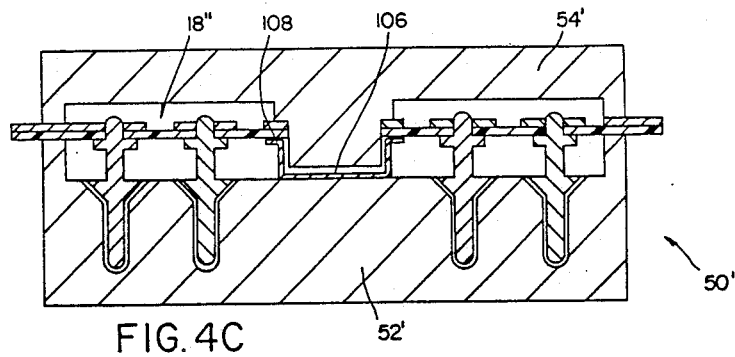
Figure 4D:
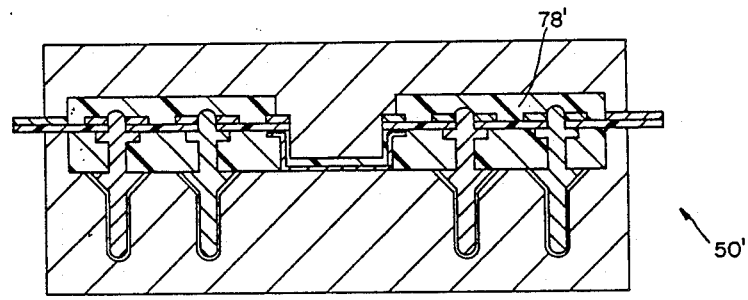
Figure 4E:
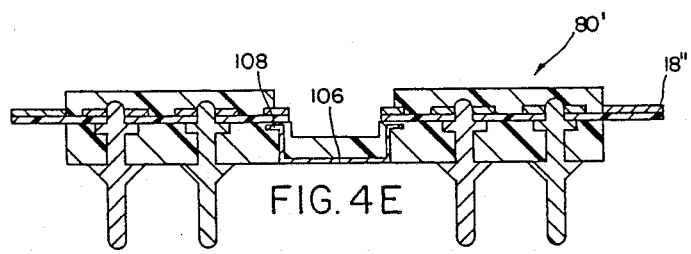

The cover component 54' is then disposed on the base component 52', as illustrated in FIG. 4C in order to close the mold 50'. In this embodiment, the ends of the tape 18" project from the sides of the mold 50'. A heat sink cup 106 is also incorporated in the mold to be encapsulated into the final package 80'. The heat sink cup 106 may have any desired shape and be provided with cooling fins if desired. The heat sink cup 106 is provided with a collar 108 to support the tape 18". The collar support may be particularly beneficial during the molding of the polymer resin in the mold. The heat sink may also be incorporated in any of the embodiments disclosed herein. Then, as described in the series of process steps 3C through 3E, the mold 50' is illustrated as being filled with a polymer resin 78' in FIG. 4D, the package 80' is shown ejected from the mold 50' in FIG. 4E and a lid 90' seals a chip or device 82' in FIG. 4F.

The package 80', as illustrated in FIG. 4F, has the tape 18" projecting from the finished package 80'. This enables the tape 18", with the pins 26" and chip 82' encapsulated thereon, to be further processed while being carried on the tape 18". It is also within the terms of the present invention to trim off the ends of the tape 18" which project from the package 80' either before or after the recess 86' in package 80' has been sealed. Also, it is within the terms of the present invention for each of the embodiments described within this specification to be molded with the interconnect tape extending from the mold, if desired.

Figure 5A:
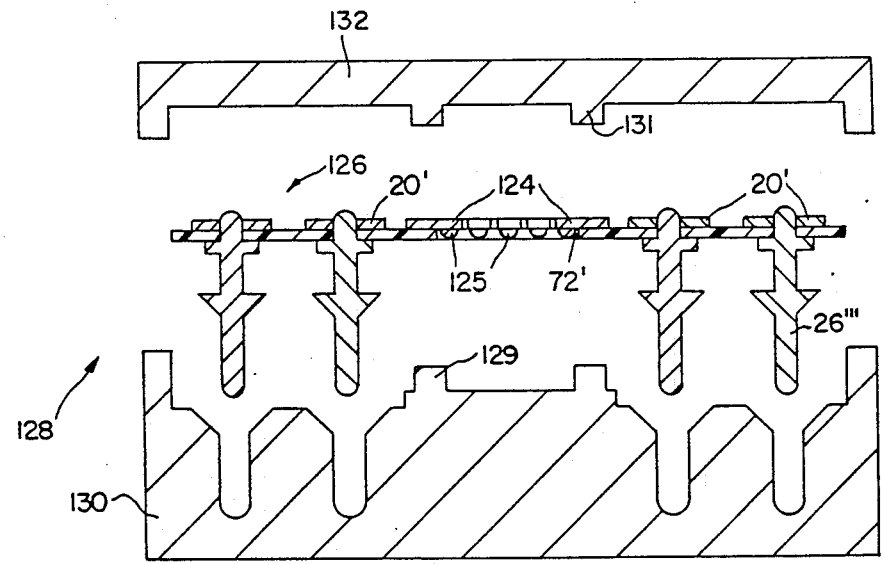
FIGS. 5A through 5E illustrate the series of steps to form a second embodiment of a plastic integrated circuit pin grid array package.
Figure 5B:
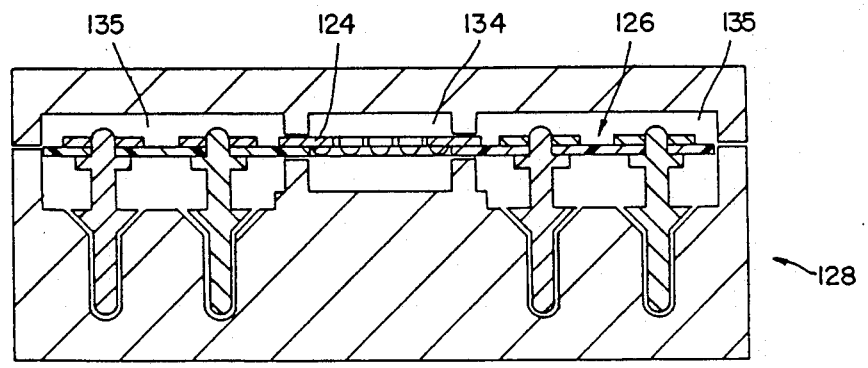
Figure 5C:
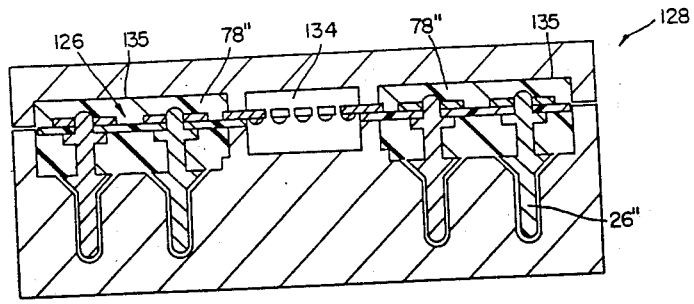
Figure 5D:
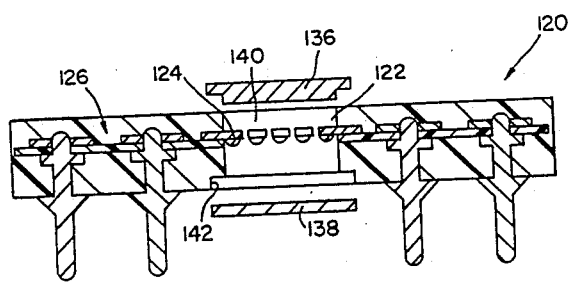

Referring to FIGS. 5A-5E, there is illustrated the series of steps for constructing a second embodiment of an integrated circuit pin grid array package 120. The completed package 120, as illustrated in FIG. 5D, has a centrally disposed integrated circuit device connect recess or cavity 122 extending therethrough. The leads 124 which are an integral part of interconnect tape 126 extend into the connect recess 122.

As illustrated in FIG. 5A, the mold 128 used to construct the package 120 is substantially the same as the mold 50 described herein before. The primary differences reside in the addition of a projection 129 on the mold base component 130 and a projection 131 on the mold cover 132. When the mold 128 is closed as illustrated in FIG. 5B, the projections 129 and 131 abut each other with the tape 126 disposed therebetween. The mold 128 now forms a centrally disposed chip connect recess 134.

The interconnect tape 126, as illustrated in FIG. 5A, is essentially the same as the tapes 18 and 18' described hereinbefore. The pins 26''' are schematic representations of the pin 26 illustrated in FIG. 2. The difference between tapes 18 and 18' resides in the provision of leads 124 which extend over the aperture 72' in cantilever fashion. The leads 124 which are an integral part of the metal interconnect circuit pattern 20' are illustrated with bumps 125. However, it is within the terms of the present invention to form the bumps on the integrated circuit device 82'' and form the leads without bumps 125. Also, the leads may be plated as required. For example, they may be gold plated over a nickel barrier layer. Further, any portion of the the circuit pattern 20' may also be plated as required. It is also within the terms of the present invention for the tape 126 to be inverted with respect to the terminal pins 26'''. In that case, bumps 125 on the leads 124 project towards the base component 130 but do not extend into the aperture 72' formed in the tape 126. As illustrated in FIGS. 5A through 5E, the leads may project from any side of the package 120 into the recess 134.

Once the tape 126 and the terminal pins 26'' are positioned in the mold 128, a polymer resin 78'' fills the mold cavity 135 as illustrated in FIG. 5C. The projections 129 and 131 prevent the polymer 78'' from filling the recess 134. Then the package 120 is ejected from the mold 128 using any desired means such as hydraulically actuated pins (not shown).

The package 120 has the connect recess 122 sealed after the integrated circuit device has been bonded to the device 82''. As shown in FIG. 5D, this may be accomplished with lid and base caps 136 and 138, respectively. The caps 136 and 138 may be formed of any desirable material such as the material used to construct lid 90. The caps 136 and 138 seal the openings 140 and 142, respectively, to the cavity 122. The caps 136 and 138 may be sealed to the package 120 by any desired means, such as with a polymer. It is also within the terms of the present invention to seal the recess 122 with any other means such as an polymer as described herein.

Figure 5E:
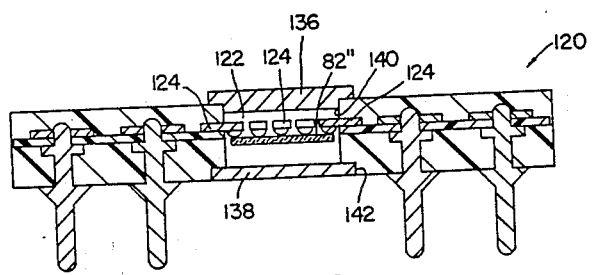

The cavity 122, which extends through the package 120, enables an integrated circuit chip assembly 82'' to be bonded to the TAB tape 126 using TAB bonding techniques. A heated pedestal, not shown, may be inserted through the opening 142 in the package 120 to provide a heated support for chip 82''. Then, a thermode of a TAB bonding machine, not shown, may be inserted through the opening 142 to bond the bumped leads to the chip device 82''. As illustrated in FIG. 5E, after the chip 82'' is bonded to the leads 124, the caps 136 and 138 are preferably adhesively sealed into the openings 140 and 142, respectively, to seal the cavity 122.

Referring to FIGS. 6A through 6D, there is illustrated a process for forming a third embodiment of an integrated circuit pin grid array package 150. The tape 124' has an integrated circuit device 82''' bonded thereto by any means such as with a TAB bonding technique. Then, the tape 124' also has the terminal pins 26'' locked thereto and, if desired, connected by means such as soldering, as described herein. The tape 124' serves as a carrier to position the pins 26'' in the holes 60' of the base component 157.

Figure 6A:
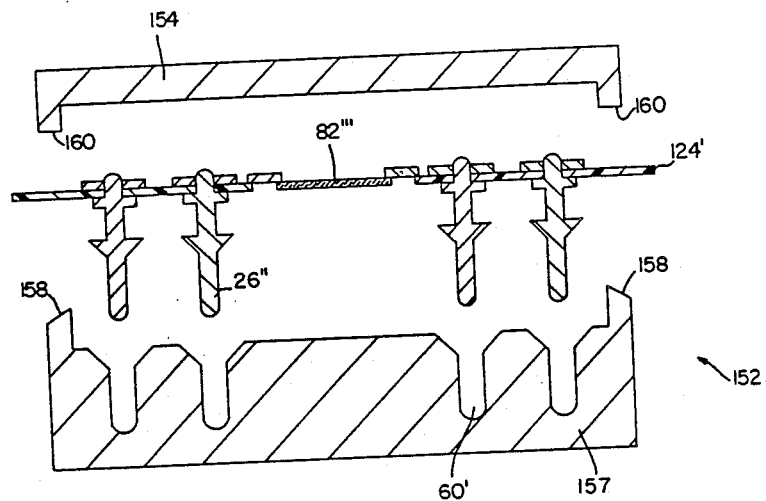
FIGS. 6A through 6D illustrate the series of steps to form a third embodiment of a plastic integrated circuit pin grid array package wherein an integrated circuit device is bonded to a TAB tape having terminal pins extending therethrough and the tape with the pins and integrated circuit are encapsulated in a plastic polymer resin.
Figure 6B:
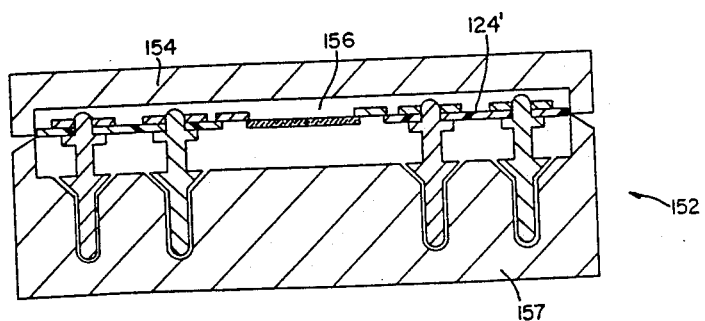
Figure 6C:
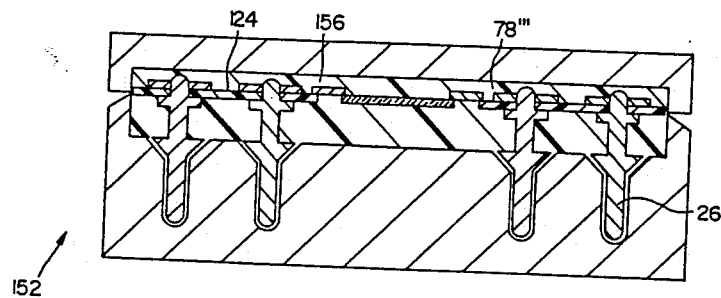
Figure 6D:
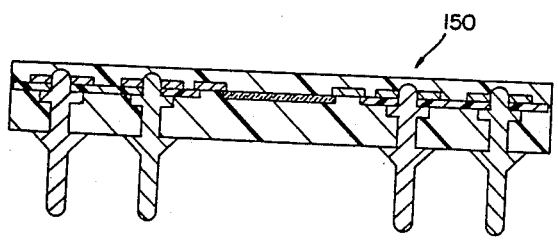

The package 130 is formed in a mold 152 which is similar to the mold 50 used to form the package 80 of the first embodiment. The primary difference is that the mold cover 154 is shaped to form a cavity 156 when abutted against mold base component 157, as illustrated in FIG. 6B. When the cavity 156 is filled with the organic polymer 78''', as illustrated in FIG. 6C, the tape 124', including the chip 82''' and the terminal pins 26'' are encapsulated by a polymer resin 78'''. The mold 152 also enables the tape 124' to be severed after the tape has been disposed within the mold 152. The mold base 157 has a cutting edge 158 which contacts the surface 160 of the mold cover 154. After the tape 124' is pulled into the mold 152, typically from a reel, the mold 152 closes and shears off the tape 124', as illustrated in FIG. 6B. Then, the polymer 78''' will flow around the edges of the tape 124, so that the final package 150 completely encapsulates the tape 78''' and the chip device 82'''. Complete encapsulation may be important to diminish the opportunities for atmospheric exposure to the tape 78'''. Although a particular cutting technique has been illustrated, it is within the terms of the present invention to use any means associated with the mold 152 to cut the tape 78''' after the latter has already been placed within the mold 152. This technique of cutting the TAB tape during the step of closing the mold is applicable to any of the the other mold configurations discussed hereinbefore.

Referring to FIG. 7, there is shown a schematic illustration of an automatic assembly line 170 for inserting interconnect tape having terminal pins attached thereto into a mold 172. The tape having the pins attached is rolled off a reel 174, schematically illustrated. The tape layers may be separated from each other on the reel 174 by means of inserts. After the tape enters the mold 172, the mold closes as indicated by the dotted lines 176 and the mold is filled with a polymer. Then the mold opens and the package 178 is ejected and moved downstream to another reel, not shown, which is essentially the same as reel 174. It is also within the terms of the present invention to insert the pins in the mold and then lock them onto the tape, to cut the tape in the mold or to perform any other of the processes described hereinbefore.

Referring to FIGS. 12A through 12F, there is illustrated another embodiment of the present invention. The pins 26$^a$ have been soldered to the interconnect tape 18 as described hereinabove. If a "cavity up" package is desired, the dielectric layer 22 of the interconnect tape 18 is in contact with the pin shoulder 39' as illustrated in FIG. 11C. If a "cavity down" package is desired, the electrically conductive layer 20 of the interconnect tape 18 is in contact with the pin shoulder 39' as also shown in FIG. 11C.

Figure 12A:
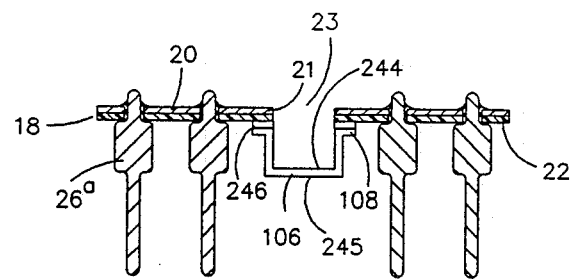
FIGS. 12A through 12F illustrate a series of steps to form other embodiments of the pin grid array package. The embodiments exploit the advantages gained by soldering the pins to the flexible circuit, namely improved electrical conductivity and increased rigidity.
Figure 12B:
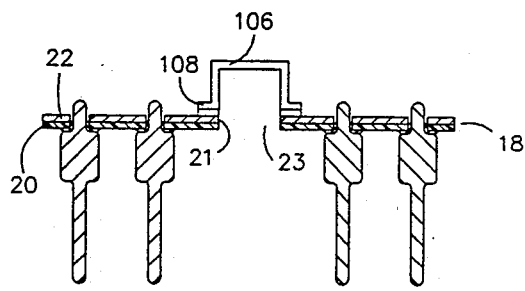

A heatsink 106 is attached to the interconnect tape 18 as shown in FIG. 12A. The heatsink is a cup-like structure with a flat interior base 244 for receiving a semiconductor device, an exterior base 245 and a collar 108 to support the interconnect tape 18. The heatsink may be fashioned from any material not affected by the temperatures required for molding the polymer resin. Preferably the heatsink is an electrical conductor to maintain electrical contact with the backside of the electronic device. Most preferably, the heatsink is copper or aluminum or alloys thereof. Copper and aluminum are preferred because they have excellent thermal conductivity properties and the coefficient of thermal expansion is close to that of the polymer resin. The coefficient of thermal expansion of the polymer resins are generally in the range of about $150-600\times10^{-7}$ in/in/° C. and preferably selected to be between $150-200\times10^{-7}$ in/in/° C. Using copper or aluminum or alloys thereof limits the thermally induced stresses between the heatsink and the molding resin.

The heatsink is attached to the interconnect tape as shown in FIGS. 12A for the "cavity up" configuration and 12B for the "cavity down" configuration The collar 108 is attached to the interconnect tape 18. The attachment means 246 may be either a polymer adhesive, for example an epoxy, or solder. If soldering is elected, a seal ring, not shown, may be added to the interconnect tape. One example would involve using a five layer TAB tape comprised of copper, adhesive, polyimide, adhesive, and copper layers The first copper layer is fashioned into the electrical conductive paths, while the second copper layer is fashioned in the seal ring for soldering to the heatsink. The heatsink may also be plated to enhance solderability and corrosion resistance. One possible plating sequence is a nickel barrier layer beneath a hard gold.

The heatsink is aligned with the interconnect tape aperature 23 so the leads 21 forming the terminations of the metal interconnect circuit pattern 20 are supported by the heatsink collar 108. The heatsink collar prevents the leads from shifting during subsequent encapsulation and permits more accurate bonding to a semiconductor device.

The addition of the solder and heatsink to the flexible circuit has been found to supply the assembly 18' with sufficient rigidity to be used as a package in non-hostile environments. A semiconductor device is attached to the heatsink and electrical connections made between the leads and bonding sites on the semiconductor chip. Either a lid is attached to the interconnect tape or the heatsink cavity is filled with silicone glob.

Figure 12C:
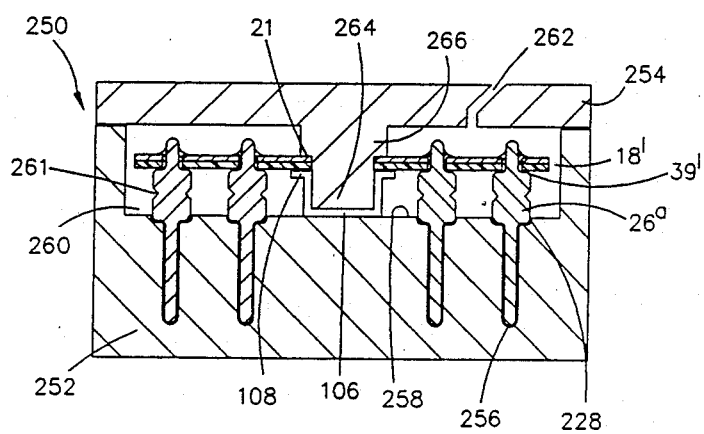

Increased durability and ease of handling usually necessitates encapsulating the assembly 18' within a polymer resin as described herein above. In a first embodiment shown in FIG. 12C, the interconnect tape 18' with the pins $26^a$ soldered thereto and the heatsink 106 bonded to the leads 21 is placed in a mold 250. The mold 250 is comprised of a base component 252 and a cover component 254. The base component 252 contains a plurality of holes 256 positioned to align with the pins $26^a$ soldered to the interconnect tape 18'. The depth of the holes 256 is such that the second shoulder 228 rests on the surface 258 of the base component of the mold. When the mold cavity 260 is filled with polymer resin, second shoulder 228 becomes a portion of the package base firmly locking pins $26^a$ into place In an optional embodiment as shown in FIG. 12C, notches 261 may be included in the collar. The notches fill with resin durining molding further locking the pins in place.

The cover component 254 contains an aperture 262 for the introduction of the polymer resin. The aperture is preferably located within the cover component so inflowing polymer resin will direct the interconnect tape 18' against the first shoulder 39' of the pins $26^a$. It has been found the interconnect tape remains flatter when the polymer resin is introduced through the cover components.

The cover component 254 further contains a projection 264. The projection 264 prevents the polymer resin from entering the heatsink cavity. The projection 264 further serves to position the heatsink in the precise position desired.

The projection 264 contains a step-like member 266, which presses against the leads 21 during molding. The step-like member prevents resin from flowing onto the leads and also by pressing on the collar 108 of the heatsink, maintains the planarity of the leads to facilitate electrical interconnection of the semiconductor chip to the leads.

While FIG. 12C illustrates the mold configuration for a "cavity up" package, it should be apparent to one skilled in the art that a "cavity down" package could also be molded with minor modifications to the mold 250. For the "cavity down" package, the projection 264 would be a portion of the base component and press the heatsink firmly against the cover component.

Figure 12D:
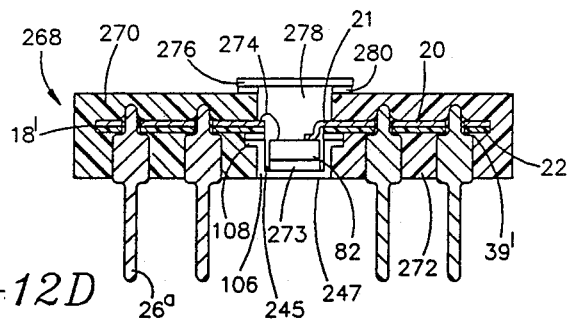

FIG. 12D shows a plastic pin grid array package 268 manufactured in accordance with the present embodiment. The interconnect tape 18' with the pins $26^a$ attached is encapsulated within a polymer resin body 270. The heatsink 106 forms a portion of the exterior surface 272 of the package. The exterior base 247 of the heatsink is exposed to the external environment to facilitate heat removal. The exterior base may be flush with the surface of the package as shown in FIG. 12-D, somewhat raised as shown in FIG. 12-F or somewhat recessed. A thermally conductive gas or liquid may be forced across the heatsink surface to increase cooling capabilities or fins or other surfaces may be attached to the heatsink surface to increase thermal dissipation.

After the package 268 is removed from the mold a semiconductor chip 82 is attached to the interior base 245 of the heatsink by a die attach 272. If the heatsink 108 is fabricated from a material with a coeffiecient of thermal expansion (CTE) close to that of the chip, for example the low expansion iron, nickel, cobalt alloy known by the tradename KOVAR or an alloy of copper and tungsten, the die attach may be any die attach solder known in the industry such as gold tin or gold silicon eutectic solders. If the heatsink is a highly thermally conductive high CTE material, for example a copper based alloy, the die attach is usually a lead based solder or a conductive polymer resin, for example a silver filled epoxy.

After die attach, the semiconducter chip 82 is electrically connected to the leads 21 by either wire bonding or a TAB process. In wire bonding, a thin wire 274, usually about .001" diameter and composed of gold, aluminum or copper, connects bonding sites on the semiconductor chip 82 to the leads 21.

In the TAB process, the electrically conductive layer 20 of the interconnect tape 18' extends beyond the dielectric layer 22 in cantilever fashion. The extension is bonded to bonding sites on the semiconductor chip 82 by standard TAB techniques.

After the chip is electrically connected to the leads 21, a lid 276 seals the enclosure 278 to protect the semiconductor chip 18. The lid is sealed to the package 268 by an adhesive or solder ring 280. In the alternative, as a replacement for or in addition to a lid, the enclosure 278 may be filled with a soft gel, for example silicone, (not shown) by the process known as "glop topping". Also, the cavity may be filled with an epoxy which is then cured.

FIG. 12D illustrates several of the advantages of the present invention over the prior art. The pins 26$^a$ are firmly locked into the encapsulating resin 270. The interconnect tape is supported by the first shoulders 39' and the heatsink collar 108. The leads 21 are supported by the heatsink collar to aid wire or TAB bonding. The package 268 is of one piece construction to limit moisture penetration. The interconnect tape 18' is encapsulated within the resin 270 to further protect the tape.

Figure 12E:
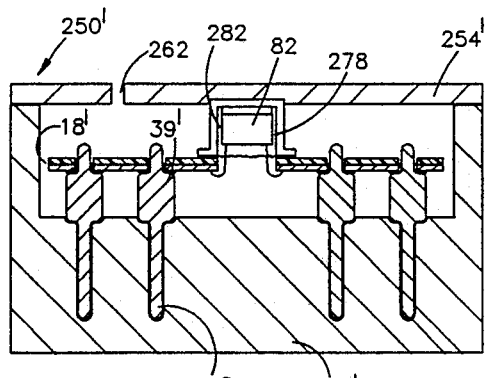

FIG. 12E shows yet another embodiment of the present invention. Prior to insertion into the encapsulation mold 250', the semiconductor chip 82 is attached to the heatsink and electrically connected, as discussed hereinabove. The enclosure 278 is filled with a soft gel 282. The encapsulating mold 250' is comprised of a base component 252' and a cover component 254'. An aperature 262 is provided in the cover component to provide a site for introduction of the polymer resin. As in the preceeding embodiment, the resin is preferably introduced through the cover component 254' so the resin presses the interconnect tape 18' against the first shoulder 39'' of the pins 26$^a$.

Figure 12F:
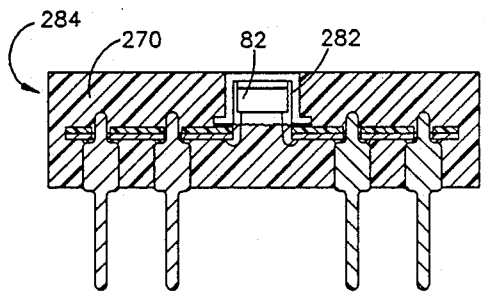

The present embodiment provides a one piece molded plastic pin grid array package as shown in FIG. 12F. While a "cavity down" package is illustrated it would be apparent to one skilled in the art that encapsulation mold 250' of FIG. 12E could be configured for a one piece "cavity up" package.

Referring back to FIG. 12F, the polymer resin body 270 of the one piece package 284 has a CTE of about $150-600 \times 10^{-7}$ in/in/° C. The semiconductor chip 82 is usually made of silicon with a CTE of about $49 \times 10^{-7}$ in/in/° C. When the package is in operation, the semiconductor chip heats up due to electrical resistance within the circuity of the chip. The "glop top" serves as a buffer to prevent the higher CTE polymer resin from rubbing over the surface of the lower CTE semiconductor chip during TC possibly resulting in damage to the circuitry located on the face of the semiconductor chip 82. If a lower CTE polymer resin is used, a buffer system, such as "glop topping", may not be required. An added advantage of the present embodiment is the absence of a lid seal further protects the semiconductor device from moisture permeation.

Figure 8A:
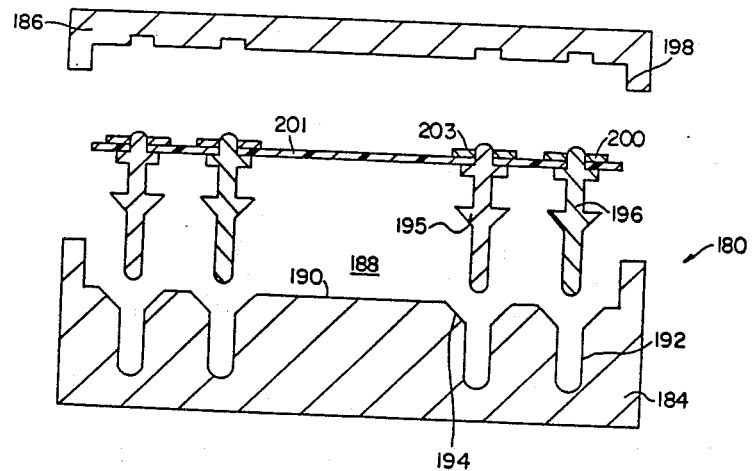
FIGS. 8A through 8D illustrate the series of steps to form a pin grid array adapter package.
Figure 8B:
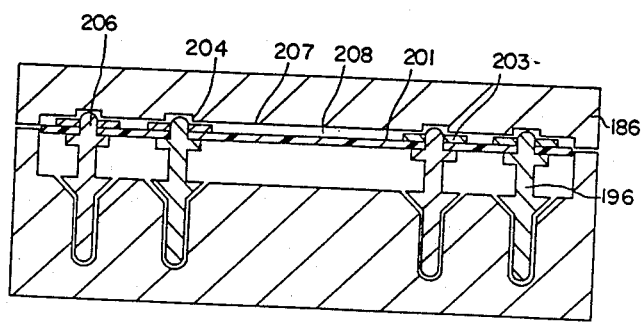
Figure 8C:
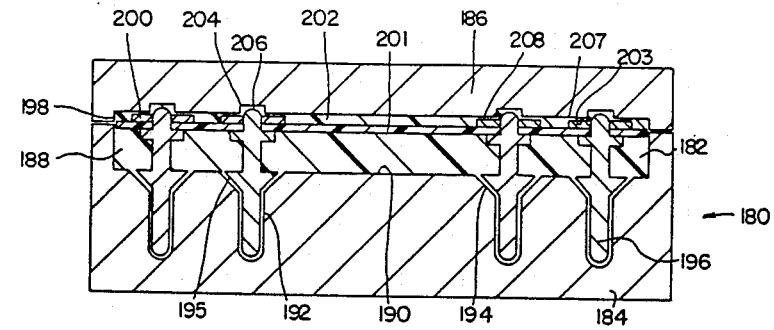
Figure 8D:
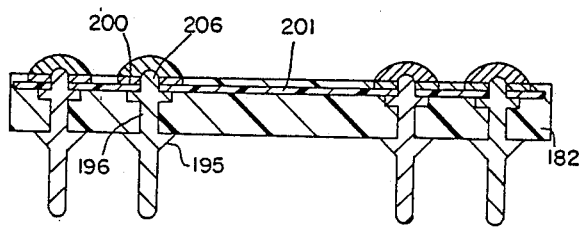

Referring to FIGS. 8A through 8D, there is illustrated the series of steps for constructing an integrated circuit pin grid array adapter package 182. The completed package 182 is illustrated in FIG. 8D. The tape 201 has terminal pins 196 joined thereto and, if desired, bonded by means such as solder 197.

Referring to FIG. 8A, there is illustrated a mold 180 adapted for constructing a pin grid array adapter package 182. As with the molds described hereinbefore, the mold 180 includes a base component 184 and a lid component 186. The base component 184 has a recess 188 with a base surface 190. A plurality of holes 192 project into the base component 184 from the base surface 190.

The holes 192 may include cone shaped walls 194 which are sized to receive the cone shaped sections 195 of the terminal pins 196. Pins 196 are substantially identical to the pins 26 described hereinbefore Referring to FIGS. 8B and 8C, the cover component 186 includes a shallow recess 198 which is preferably sized to be at least about the thickness of the metal interconnect pattern layer 200 of interconnect tape 201. The interconnect pattern layer 200 is substantially identical with the metal layer 20 of interconnect tape 18 previously described. The tape 201 is inserted into the mold and affixed to the pins 196 in accordance with the principles described hereinbefore. The cover component 186 is constructed to position the tape 201 so that the organic polymer resin 202, which may be selected from the same group as organic resin 78, extends substantially flush with the upper surface 203 of the pattern layer 200. The upper surface of the pattern layer 200 is substantially free from resin 202 in order that the layer 200 can be solder bonded to a semiconductor package, as described herein. This may be accomplished by providing indentations 204 in an inner surface 207 of the mold cover 186 to receive the ends 206 of the pins 196. Then, the upper surface 203 can contact the surface 207 of the cavity 208 and thereby substantially prevent the resin 202 from contacting the surface 203.

The adapter package 182, as seen in FIG. 8D, is formed in the mold 180 using the procedures and concepts described hereinbefore. For example, the pins 196 are inserted through the interconnect tape 201 either before or after insertion into the mold 180. The interconnect tape 201, as illustrated, is exemplary and any desired number or configuration of pins may be incorporated as required for the particular application. The ends 206 of the pins 196 can be bonded with solder 197 to layer 200. This step may be either prior or subsequent to injecting the resin 202 into the mold. Then the polymer resin 202 is injected into the cavity 208 formed between the cover component 186 and the base component 184. As with the embodiments described hereinbefore, the tape 201 can be cut to the desired size by any means either before or after its placement into the mold 180. Then the mold is opened and the adapter package 182 is removed from mold 180.

Figure 9:
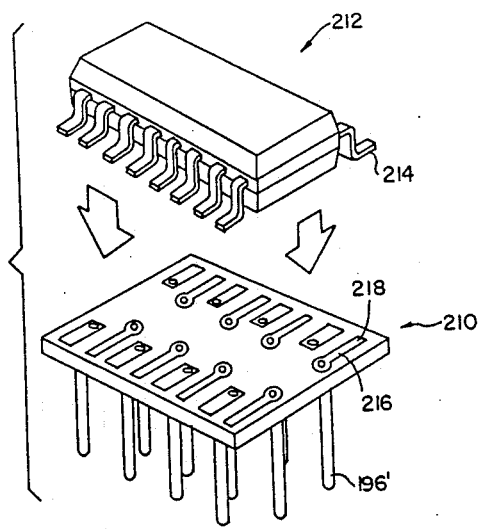
FIG. 9 illustrates a pin grid array adapter package adapted to be soldered to a leaded chip carrier.

An exemplary application of an adapter package 210, which is similar to and constructed in accordance with the principles relating to the construction of package 182, is illustrated in FIG. 9. A dual-in-line semiconductor package 212, having gull-wing shaped leads 214, requires adapting to mount it on a circuit board having pin holes. The package 212 can first be attached to the adapter package 210 by any desired means such as soldering. For example, the leads 214 are soldered to the upper surface 216 of the pattern layer 218. Then the pins 196' of the adapter package 210 can be inserted into a circuit board (not shown).

Figure 10:
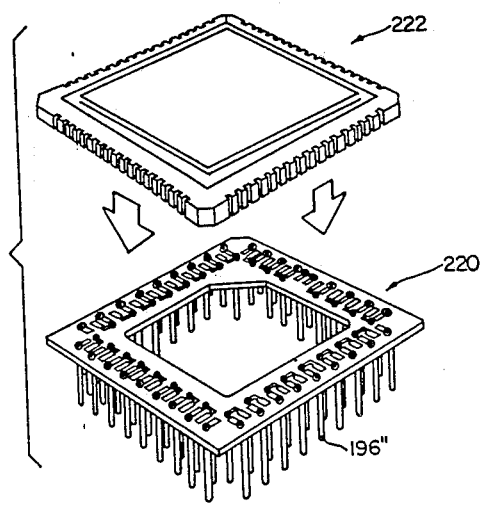
FIG. 10 illustrates a pin grid array adapter package adapted to be soldered to a leadless chip carrier.

Another exemplary application of an adapter package 220, which is similar to and constructed in accordance with the principles relating to the construction of package 182, is illustrated in FIG. 10. A leadless chip carrier 222 requires adaptation to mount it on a circuit board (not shown) having pin holes. The package 222 can first be attached to the adapter package 220 by any desired means such as soldering. Then the pins 196'' of the adapter package 222 can be inserted into the circuit board (not shown).

Although the interconnect tape 18 is described as a TAB construction, it is also within the terms of the present invention to construct the interconnect tape 18 from a metal layer with a dielectric backing such as polyimide glass or epoxy glass.

The patents, application and articles set forth in this application are intended to be incorporated in their entireties by reference herein.

It is apparent that there has been provided in accordance with this invention a process for manufacturing plastic pin grid arrays and the product produced thereby which satisfy the objects, means and advantages set forth hereinabove. While the invention has been described in combination with the embodiments thereof, it is evident that many alternatives, modifications, and variations will be apparent to those skilled in the art in light of the foregoing description. Accordingly, it is intended to embrace all such alternatives, modifications and all variations as fall within the spirit and broad scope of the appended claims.

What is claimed:

1. A process for forming an integrated circuit pin grid array package, comprising the steps of:
    providing an interconnect tape having first and second opposing surfaces, said first surface having a metal circuit pattern defining a plurality of leads;
    forming a plurality of holes of a first diameter in said metal circuit pattern;
    providing a plurality of pins, said pins defined by a pin head end of a second diameter, an insertion end and a collar of a third diameter disposed therebetween, said collar defined by first and second shoulder wherein said third diameter is larger than said first diameter and said first diameter is larger than said second diameter;
    inserting said insertion end of said pin into a first fixture;
    placing said interconnect tape over said pin head end such that said holes in said circuit pattern encircle said pin heads and said interconnect tape rests on said first shoulder of said pins; and
    soldering said pins to said interconnect tape using a mask to control said solder.

2. The process of claim 1 including the additional steps of providing said mask with first and second opposing sides and a plurality of holes of a fourth diameter, said fourth diameter larger than said first diameter and smaller than said third diameter,
    placing said mask over said pin heads so said first side of said mask rests on said first shoulder of said pins with said interconnect tape disposed therebetween,
    applying said solder as a solder paste to said second side of said mask, and
    distributing said solder paste across the second side of said mask so said solder paste is deposited within the holes of said mask.

3. The process of claim 2 providing the length of said pin head is greater than the thickness of said interconnect tape and said mask combined.

4. The process of claim 3 further providing the length of said pin head is at least .010 inches greater than the thickness of said interconnect tape and said mask combined.

5. The process of claim 4 further providing the length of said pin head is from about .010 inch to about .020 inch greater than the thickness of said interconnect tape and said mask combined.

6. The process of claim 5 including coating said pin head and said first shoulder with a second metal or metal alloy to increase solder wetting.

7. The process of claim 2 including the step of forming said solder paste as a mixture of a low melting temperature metal alloy powder and a liquid vehicle.

8. The process of claim 7 including selecting said metal alloy powder to be either tin/lead or tin/silver and said liquid vehicle to be a rosin based flux.

9. The process of claim 8 further providing said rosin based flux occupies from about 5 volume percent to about 35 volume percent of said solder paste, 10. The process of claim 9 providing said first surface of said interconnect tape is in contact with said first shoulder of said pin.

11. The process of claim 9 providing said second surface of said interconnect tape is in contact with said first shoulder of said pin.

12. The process of claim 2 including the additional step of encapsulating in a single step, a portion of said interconnect tape including the edges thereof, a portion of said heat sink and said soldered pins except for said insertion end and said second shoulder within a polymer resin.

13. The process of claim 12 including selecting said polymer resin to be either thermosetting or thermoplastic with a molding temperature less than the melting temperature of said solder.

14. The process of claim 13 wherein said solder paste is a mixture of a metal alloy having a melting temperature of from about 150° C. to about 400° C. and a liquid vehicle.

15. The process of claim 14 wherein said metal alloy is either tin/lead or tin silver and said liquid vehicle is a rosin based flux.

16. The process of claim 14 including providing a notch within the collar of said pin to mechanically lick said pin within said polymer resin.

17. The process of claim 1, wherein said second surface of said interconnect tape defines a second metal circuit pattern and is separated from said first surface by a dielectric layer.

18. A process for forming a substantially non-encapsulated integrated circuit pin grid array package, comprising the steps of:
    providing a flexible interconnect tape having first and second opposing surfaces, said first surface having a metal circuit pattern defining a plurality of leads;
    forming a plurality of holes in said metal circuit pattern;
    providing a plurality of pins, said pins defined by a pin head end and insertion end;
    soldering said interconnect tape to said pins;
    providing a cup shaped heat sink, said heat sink being comprised of a collar component and a base component, said base component defining a cavity and having an interior surface for supporting an integrated circuit and an exterior surface; and
    attaching said heat sink to said second surface of said interconnect tape opposite said leads.

19. The process of claim 18 including coating said heat sink with a second metal to improve solderability and corrosion resistance.

20. The process of claim 19 including bonding said collar of said heat sink to said second surface of said interconnect tape.

21. The process of claim 20 including bonding said collar with a thermoplastic or thermosetting polymer adhesive.

22. The process of claim 21 providing said adhesive is an epoxy.

23. The process of claim 20 including said second surface of said interconnect tape defines a metal seal ring and disposing a solder preform between said heat sink collar and said seal ring.

24. The process of claim 23 including soldering said heat sink to said interconnect tape.

25. The process of claim 18, wherein said second surface of said interconnect tape defines a second metal circuit pattern and is separated from said first surface by a dielectric layer.

26. A process for forming an integrated circuit pin grid array package, comprising the steps of:
providing an interconnect tape having first and second opposing surfaces, said first surface having a metal circuit pattern defining a plurality of leads;
forming a plurality of holes in said metal circuit pattern;
providing a plurality of pins, said pins defined by a pin head end and a insertion end with a collar disposed therebetween, said collar defined by a first and second shoulder;
electrically connecting said pins to said metal interconnect pattern;
providing a heat sink, said heat sink being comprised of a collar component and a base component defining a cavity, said base component having an interior surface for supporting said integrated circuit and an exterior surface;
attaching said heat sink to said second surface of said interconnect tape opposite said leads;
encapsulating in a single step, at least a portion of said interconnect tape including the edges thereof, a portion of said heat sink and said pins except for said insertion end and said second shoulder within a polymer resin; and
heating said polymer resin within a mold to form a plastic pin grid array package.

27. The process of claim 26 including selecting said polymer resin to either thermosetting or thermoplastic with a molding temperature greater than about 220° C.

28. The process of claim 27 including selecting said polymer resin to have a molding temperature of from about 220° C. to about 400° C.

29. The process of claim 28 including providing a notch within the collar of said pin to mechanically lock said pin within said polymer resin.

30. The process of claim 29 including the step of attaching said integrated circuit to said interior surface of said heat sink and electrically connecting said integrated circuit to said leads prior to encapsulation.

31. The process of claim 30 including coating said electrically connected integrated circuit and said cavity of said heat sink with a compliant polymer prior to encapsulation 32. The process of claim 31 providing said interconnect tape, said heat sink and said pins except for said insertion end of said pins are encapsulated within said polymer resin.

33. The process of claim 28 providing said interconnect tape except for said leads, said heat sink except for said cavity, said exterior base and said interior base, and said insertion end of said pins are encapsulated within said polymer resin.

34. The process of claim 33 further providing a lid component and attaching said lid component to said molder polymer resin subsequent to attaching said integrated circuit device to said interior surface of said heat sink and electrically connecting said integrated circuit to said leads thereby sealing said integrated circuit within said heatsink cavity.

35. The process of claim 26, wherein said second surface of said interconnect tape defines a second metal circuit patterns and is separated from said first surface by a dielectric layer.

* * * * *